United States Patent
Yoon et al.

(10) Patent No.: US 9,249,957 B2
(45) Date of Patent: Feb. 2, 2016

(54) LIGHT EMITTING DEVICE AND LIGHTING SYSTEM INCLUDING THE SAME

(71) Applicant: LG INNOTEK CO., LTD., Seoul (KR)

(72) Inventors: Yeo Chan Yoon, Seoul (KR); Jae Hwan Jung, Seoul (KR); Yun Shick Eom, Seoul (KR); Ki Rok Hur, Seoul (KR); Jin Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 92 days.

(21) Appl. No.: 13/837,168

(22) Filed: Mar. 15, 2013

(65) Prior Publication Data
US 2014/0071700 A1    Mar. 13, 2014

(30) Foreign Application Priority Data

Sep. 13, 2012    (KR) .......................... 10-2012-0101823

(51) Int. Cl.
*F21V 21/00*    (2006.01)
*H01L 25/16*    (2006.01)
*H01L 33/62*    (2010.01)

(52) U.S. Cl.
CPC .............. *F21V 21/00* (2013.01); *H01L 25/167* (2013.01); *H01L 33/62* (2013.01); *H01L 2224/45139* (2013.01); *H01L 2224/48091* (2013.01); *H01L 2224/48247* (2013.01); *H01L 2224/8592* (2013.01); *H01L 2924/1301* (2013.01)

(58) Field of Classification Search
CPC ......... H01L 2924/00; H01L 3/52; H01L 3/54; H01L 2933/003; H01L 224/73265; H01L 33/54; H01L 33/62; H01L 25/167; H01L 2224/48247–2224/48249; H01L 2224/8592; H01L 2224/45139; H01L 2924/1301

USPC ............... 362/382, 267, 296.01, 296.05, 310, 362/311.02–311.05, 375, 612; 257/97–100, 257/666; 438/26, 129, 22, 123
See application file for complete search history.

(56) References Cited

U.S. PATENT DOCUMENTS

| 7,432,589 B2 * | 10/2008 | Yamamoto et al. ............ 257/690 |
| 7,815,343 B2 * | 10/2010 | Nii et al. ................... 362/311.03 |
| 7,968,900 B2 * | 6/2011 | Hussell et al. ................... 257/99 |
| 8,269,244 B2 * | 9/2012 | Hussell ............................ 257/98 |
| 8,684,580 B2 * | 4/2014 | Min ..................... H01L 25/0753 362/241 |
| 2006/0267040 A1 * | 11/2006 | Baek et al. ....................... 257/99 |

(Continued)

FOREIGN PATENT DOCUMENTS

| JP | 2007-318161 A | 12/2007 |
| JP | 2008-041917 A | 2/2008 |
| JP | 2012-028630 A | 2/2012 |

*Primary Examiner* — Anh Mai
*Assistant Examiner* — Arman B Fallahkhair
(74) *Attorney, Agent, or Firm* — Ked & Associates, LLP

(57) ABSTRACT

Disclosed is a light emitting device. The light emitting device includes: a body including a cavity having first and second inner sides opposite to each other and third and fourth inner sides connected to first and second inner sides and opposite to each other; a first lead frame extending from a bottom of cavity under a first inner side of cavity; a second lead frame extending from the bottom of cavity under a second inner side of cavity; a gap part in the bottom of cavity between first and second lead frames; a light emitting chip on first lead frame; a protective chip on the second lead frame; a recess region recessed outward of body from at least one of third and fourth inner sides of cavity; and a first wire connected to the second frame disposed between light emitting chip and a sidewall of the recess region.

20 Claims, 11 Drawing Sheets

(56) References Cited

U.S. PATENT DOCUMENTS

2008/0037252 A1 2/2008 Nii et al. ................ 362/267
2012/0074451 A1* 3/2012 Lin ........................ 257/99
2012/0161180 A1* 6/2012 Komatsu et al. ............ 257/98
2013/0056780 A1* 3/2013 Kono ..................... 257/98
2013/0299854 A1* 11/2013 Lee et al. ................ 257/88

* cited by examiner

LIGHT EMITTING DEVICE AND LIGHTING SYSTEM INCLUDING THE SAME

The present application claims priority under 35 U.S.C. §119(a) of Korean Patent Application No. 10-2012-0101823 filed on Sep. 13, 2012, which is hereby incorporated by reference in its entirety

BACKGROUND

The embodiment relates to a light emitting device and a lighting system including the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response characteristics, and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

An embodiment provides a light emitting device having a novel cavity structure.

The embodiment provides a light emitting device having a structure, in which one inner side of a cavity is formed with angles different on regions different from each other.

The embodiment provides a light emitting device including a recess region having a predetermined width in one inner side of a cavity.

According to the embodiment, there is provided a light emitting device including: a body including a cavity having first and second inner sides opposite to each other and third and fourth inner sides connected to the first and second inner sides and opposite to each other; a first lead frame extending from a bottom of the cavity under a first inner side of the cavity; a second lead frame extending from the bottom of the cavity under a second inner side of the cavity; a gap part disposed in the bottom of the cavity and disposed between the first and second lead frames; a light emitting chip on the first lead frame; a protective chip on the second lead frame; a recess region recessed outward of the body from at least one of the third and fourth inner sides of the cavity; and a first wire connected to the second frame disposed between the light emitting chip and a sidewall of the recess region, wherein the first lead frame includes a first recess portion recessed from the gap part and a second recess portion recessed from an outer surface of the body and the first recess portion has a depth different from a depth of the second recess portion.

According to the embodiment, there is provided a light emitting device including: a body including a cavity having first to fourth inner sides; a first lead frame extending from a bottom of the cavity under a first inner side of the cavity; a second lead frame extending from the bottom of the cavity under a second inner side of the cavity; a gap part disposed in the bottom of the cavity and disposed between the first and second lead frames; a light emitting chip on the first lead frame; a protective chip on the second lead frame; a recess region being convex outward of the body from at least one of the third and fourth inner sides of the cavity; and a first wire connected to the protective chip and the second lead frame and including one part disposed between the light emitting chip and a sidewall of the recess region, wherein the third inner side of the cavity includes a first sidewall corresponding to the light emitting chip at a first interval, and a second sidewall corresponding to the light emitting chip at a second interval wider than the first interval, and the second sidewall is provided closer to the gap part than to the first inner side of the cavity.

DETAILED DESCRIPTION OF THE EMBODIMENTS

Figure 1:
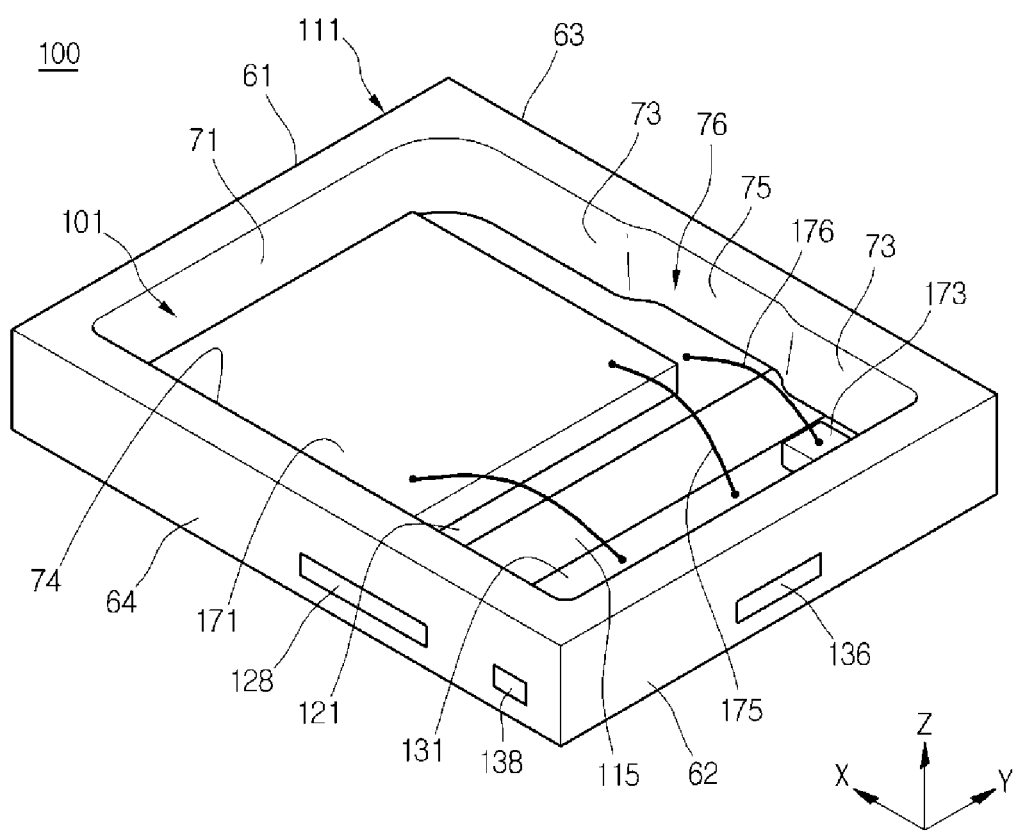
FIG. 1 is a perspective view illustrating a light emitting device according to a first embodiment.

In the description of the embodiments, it will be understood that when a substrate, a frame, a sheet, a layer, or a pattern is referred to as being "on" another substrate, another frame, another sheet, another layer, or another pattern, it can be "directly" or "indirectly" on the other substrate, the other frame, the other sheet, the other layer, or the other pattern may also be present. In contrast, when a part is referred to as being "directly on" another part, the intervening layer is not present.

Hereinafter, embodiments will be clearly comprehended by those skilled in the art with reference to accompanying drawings and the description of the embodiments. The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

Hereinafter, a light emitting device according to the embodiment will be described with reference to the accompanying drawings.

Figure 2:
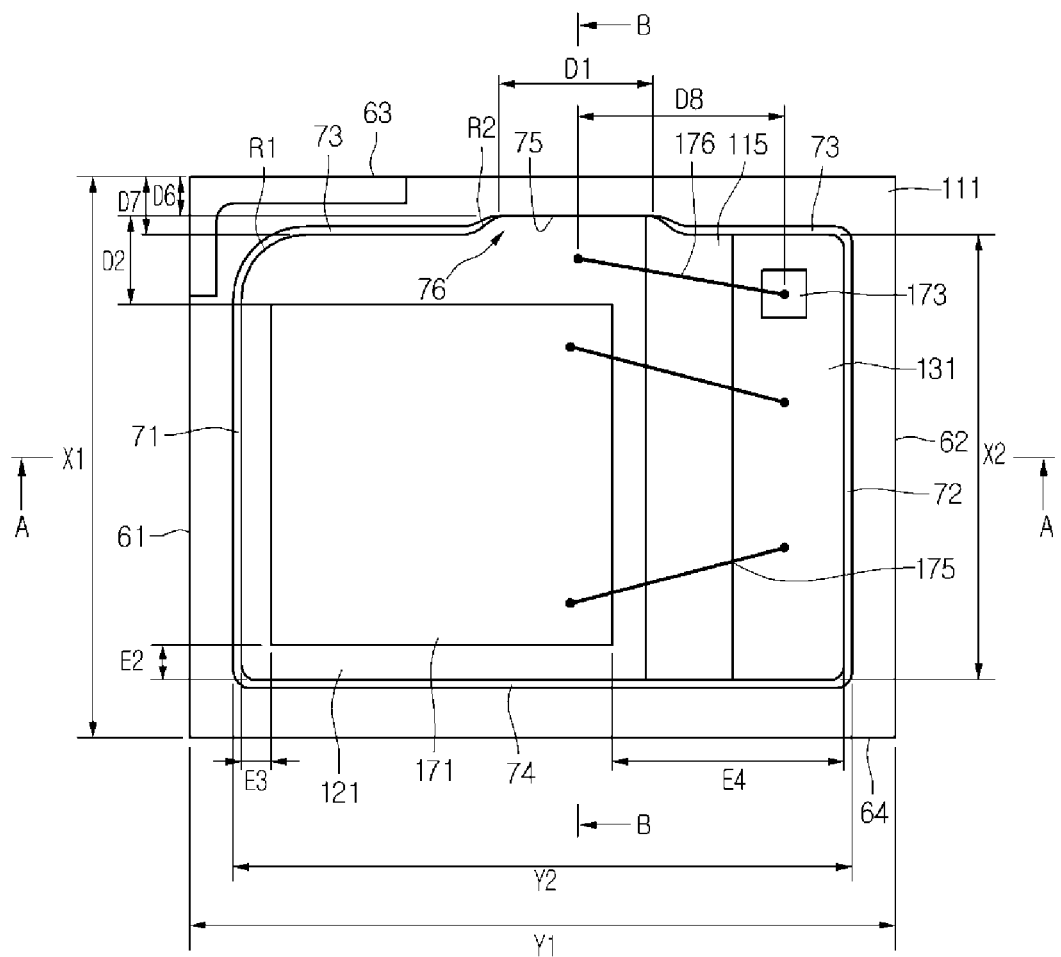
FIG. 2 is a plan view of the light emitting device shown in FIG. 1.
Figure 3:
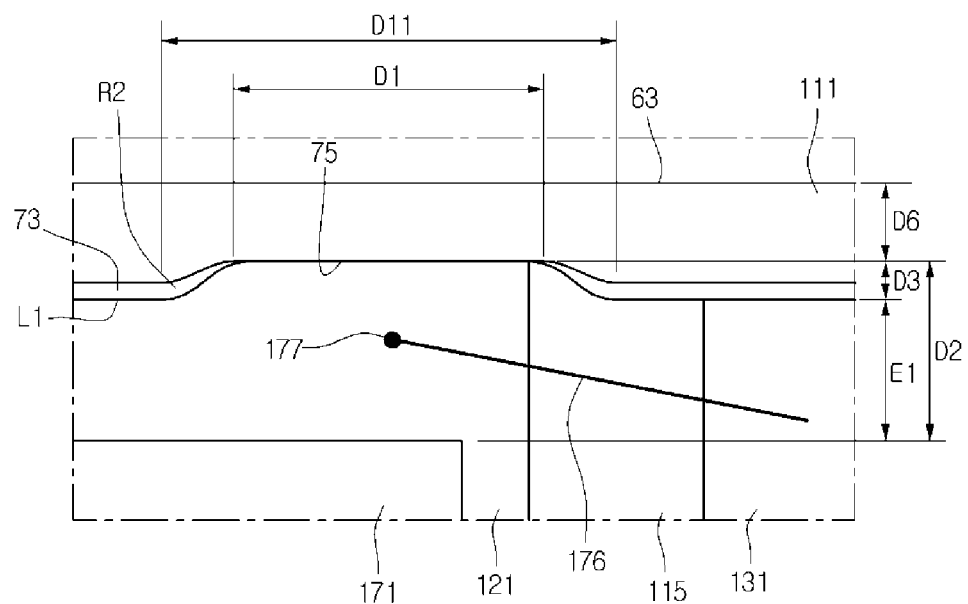
FIG. 3 is a partially enlarged view of the light emitting device shown in FIG. 1.
Figure 4:
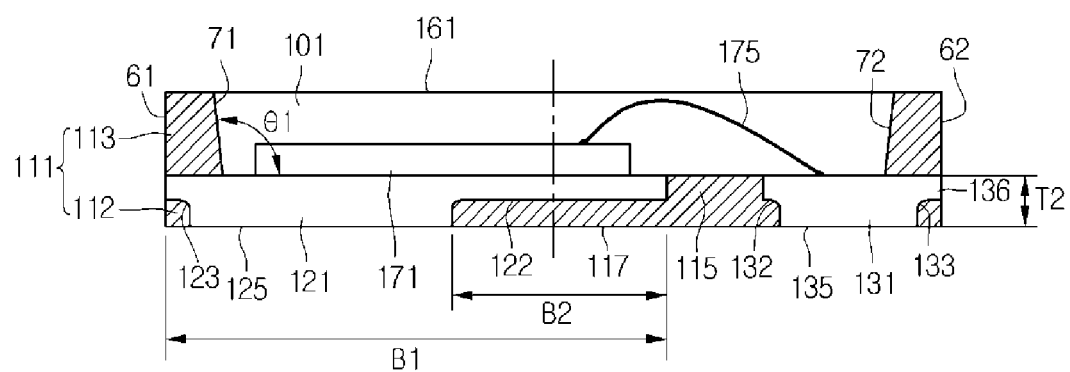
FIG. 4 is a sectional view of the light emitting device taken along line A-A of FIG. 2.
Figure 5:
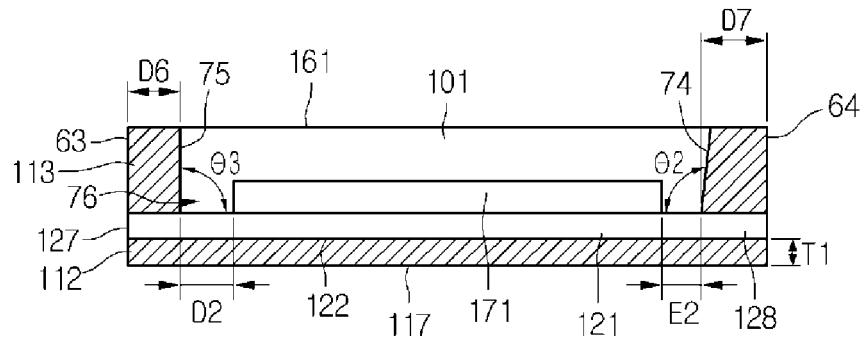
FIG. 5 is a sectional view of the light emitting device taken along line B-B of FIG. 2.
Figure 6:
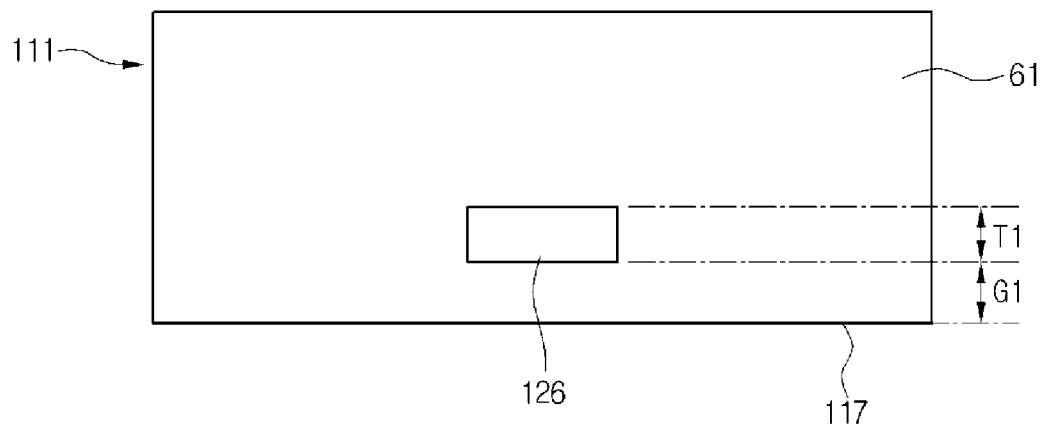
FIGS. 6 to 9 are side views illustrating a body of the light emitting device shown in FIG. 2.
Figure 7:
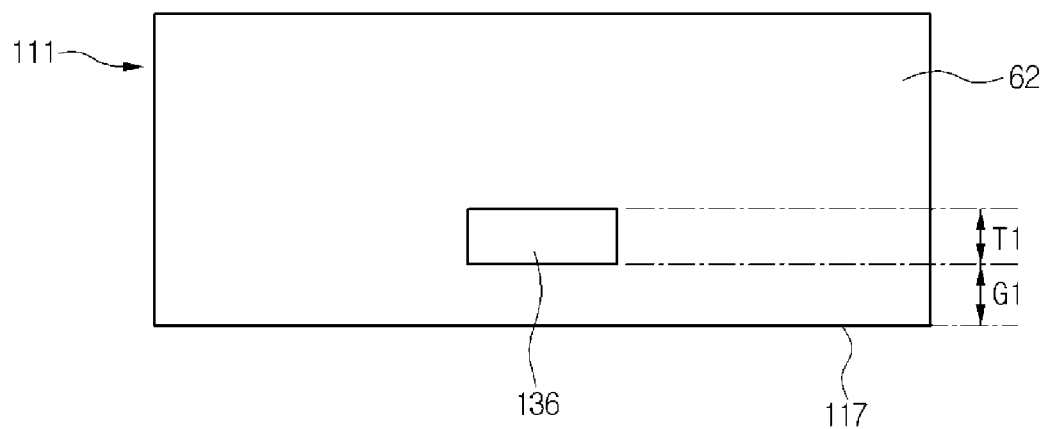
Figure 8:
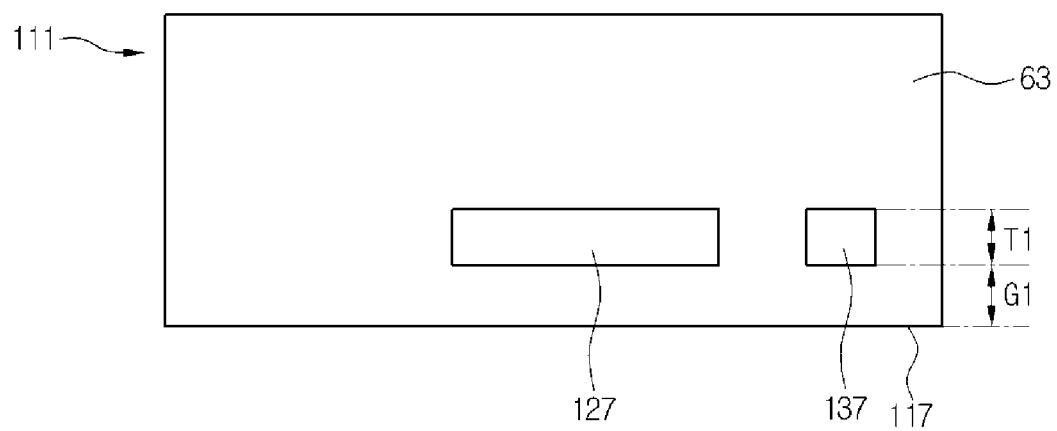
Figure 9:
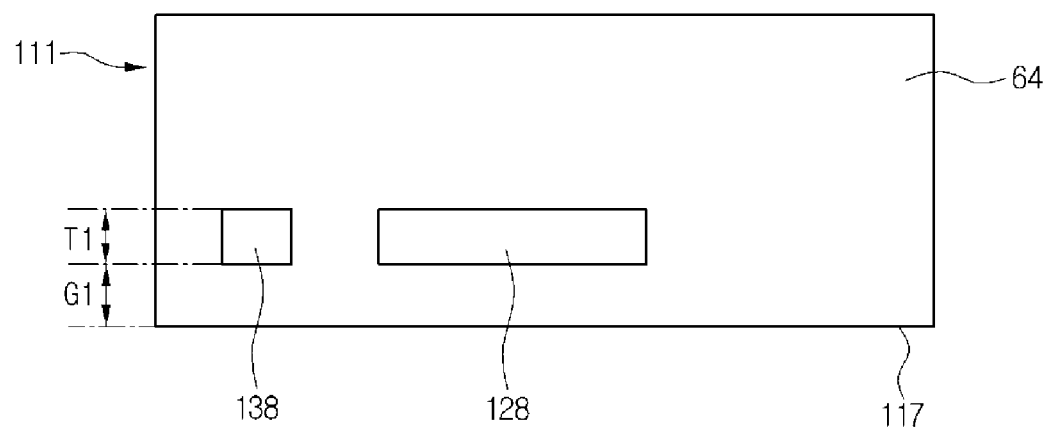
Figure 10:
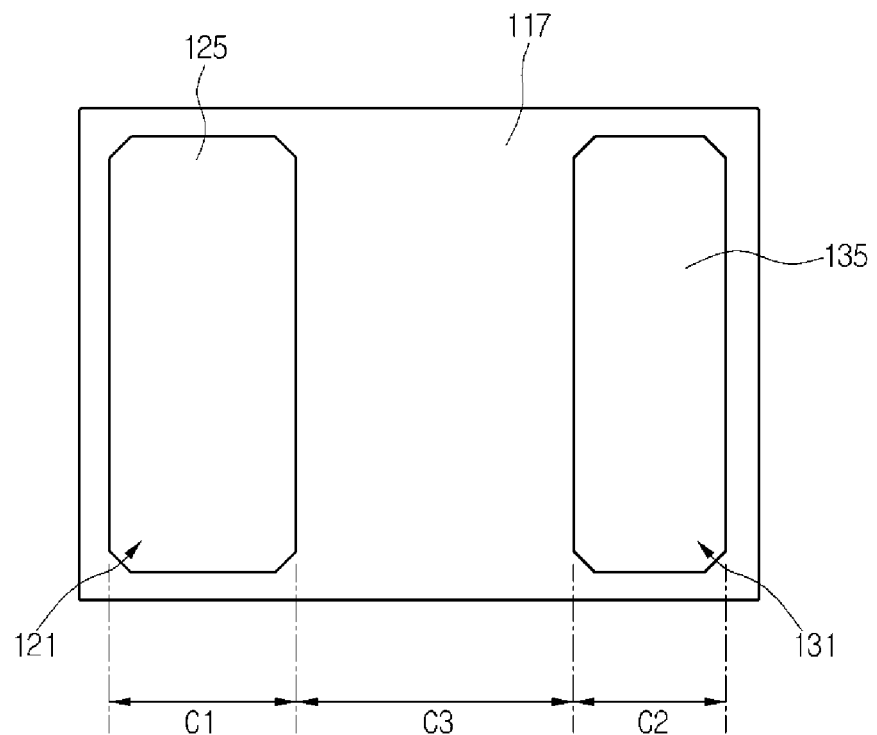
FIG. 10 is a rear view of the light emitting device shown in FIG. 2.
Figure 11:
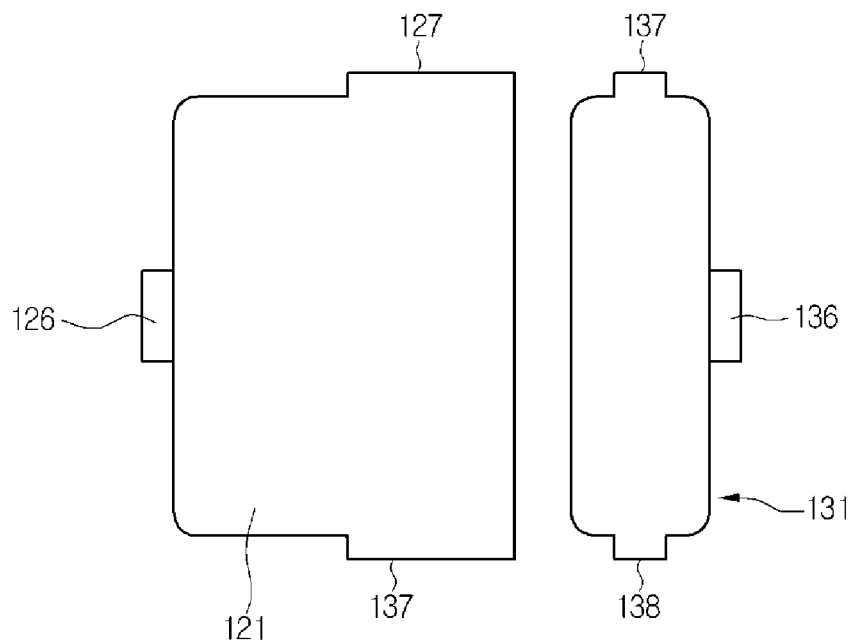
FIGS. 11 and 12 are a front view and a rear view illustrating a lead frame of the light emitting diode shown in FIG. 2, respectively.
Figure 12:
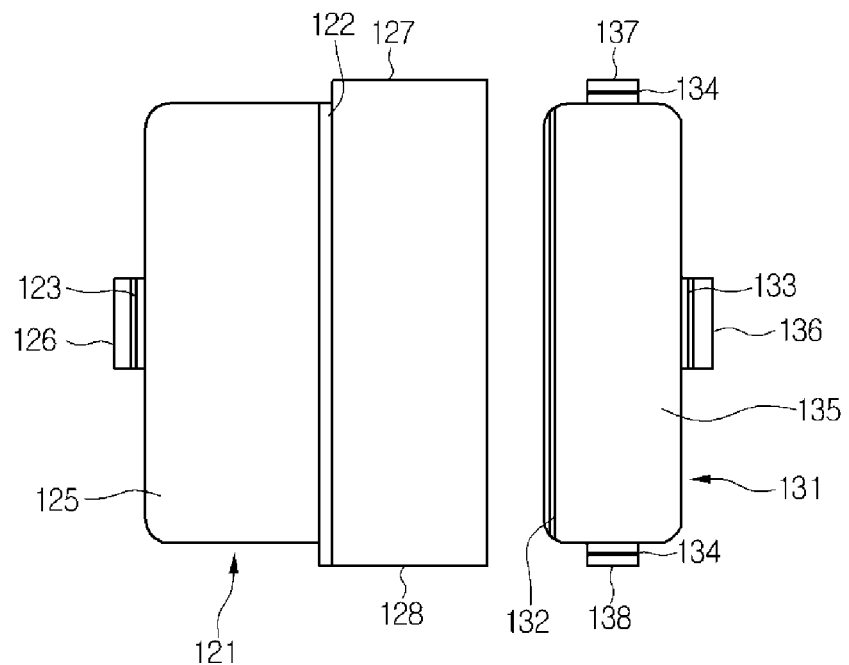

FIG. 1 is a perspective view illustrating a light emitting device according to a first embodiment, FIG. 2 is a plan view of the light emitting device shown in FIG. 1, FIG. 3 is a partially enlarged view of the light emitting device shown in FIG. 1, FIG. 4 is a sectional view of the light emitting device taken along line A-A of FIG. 2, FIG. 5 is a sectional view of the light emitting device taken along line B-B of FIG. 2, FIGS. 6 to 9 are side views illustrating a body of the light emitting device shown in FIG. 2, FIG. 10 is a rear view of the light emitting device shown in FIG. 2, and FIGS. 11 and 12 are a front view and a rear view illustrating a lead frame of the light emitting diode shown in FIG. 2, respectively Referring to FIGS. 1 to 5, the light emitting device 100 includes a body 111 having a cavity 101 with a recess region 76 at one side thereof, a plurality of lead frames 121 and 131, a light emitting chip 171, wires 175 and 176, a protective chip 173, and a molding member 161.

The body 111 may include an insulating material or a conductive material. The body 111 may include at least one of a resin material such as Polyphthalamide (PPA) or Polycyclohexylene Terephthalate (PCT), silicon (Si), a metallic material, photo sensitive glass (PSG), sapphire (Al$_2$O$_3$), and a printed circuit board (PCB). For example, the body 111 may be injection-molded by an injecting scheme, and a material of the body 111 may include a resin material such as epoxy or silicon.

The body 111 includes an epoxy molding compound (EMC) material having epoxy, and the EMC material is an insulating material having improved molding property, moisture resistance, and adhesive property. A filler including metal oxide such as TiO$_2$ or SiO$_2$ may be added to the body 111 to increase reflecting efficiency. The filler may be contained in the body 111 at the ratio of 10 wt % or more, for example, 15 wt % or more.

The body 111 may include a reflecting material for optical reflection and include a transmittance material to increase distribution of a directional angle, but the embodiment is not limited to the above.

The body 111 may have a polygonal outer appearance such as a rectangular shape or a square shape, when viewed from the top, and an outer corner part of the body 111 may have an angled surface or a curved surface.

When the body 111 of the light emitting device 100 has the square shape, the body 111 may have a plurality of sides, for example, at least fourth sides 61 to 64 or more. At least one of the sides 61 to 64 may be vertical or inclined to a bottom surface of the body 111. In the embodiment, the body 111 includes first to fourth sides 61 to 64, in which the second side 62 is opposite to the first side 61, and the fourth side 64 is opposite to the third side 63.

A width of the third side 63 or the fourth side 64 may be, for example, twice greater than a width X1 of the first side 61 or the second side 62 in the body 111. As another embodiment, widths of the first to fourth sides 61 to 64 of the body 111 are the same as each other, but the embodiment is not limited to the above.

The body 111 includes support body 112 disposed under the lead frames 121 and 131, reflecting body 113 disposed above the lead frames 121 and 131, and a gap part 115 disposed between the first and second lead frames 121 and 131. The support body 112, the reflecting body 113, and the gap part 115 may be connected to each other.

The body 111 includes a cavity 101 having an opened upper portion and having a predetermined depth, and the cavity 101 may have a cup structure or a recess structure which has a depth lower than a top surface of the body 111. The lead frames 121 and 131 and the gap part 115 may be disposed in a bottom of the cavity 101.

The cavity 101 may include a plurality of inner sides 71 to 74. The inner sides 71 to 74 of the cavity 101 may include four inner sides. At least one of the inner sides 71 to 74 may be inclined toward top surfaces of the lead frames 121 and 131 or a horizontal bottom of the cavity 101. The embodiment will be made on the assumption that the inner sides 71 to 74 of the cavity 101 are inclined. However, the embodiment is not limited to the above. For example, at least one of the inner sides 71 to 74 of the cavity 101 may be vertically formed on the top surface of the lead frames 121 and 131 or a horizontal bottom of the cavity 101. However, the embodiment is not limited to the above.

Referring to FIGS. 2 and 3, the inner sides 71 to 74 of the cavity 101 may be defined as first to fourth inner sides 71 to 74. The first inner side 71 corresponds to a first side 61 of the body 111. The second inner side 72 corresponds to a second side 62 of the body 111. The third inner side 73 corresponds to a third side 63 of the body 111. The fourth inner side 74 corresponds to a first side 64 of the body 111. The first inner side 71 and the second inner side 72 are disposed perpendicular to the third and fourth inner sides 73 and 74. Corner parts between the first to fourth inner sides 71 to 74 may have a curved surface or an angled surface. However, the embodiment is not limited to the above.

A width X2 of the second inner side 72 of the cavity 101 may be the same as the first inner side 71 of the cavity 101. However, the embodiment is not limited to the above. The first to fourth inner sides 71 to 74 may be disposed corresponding to sides of the light emitting chip 171, respectively. The light emitting chip 171 is disposed closer to the first to third inner sides 71, 73, and 74 than to the second inner side 72 of the cavity 101.

As shown in FIG. 4, an angle θ1 between the first inner side 71 or the second inner side 72 of the cavity 101 and the top surfaces of the lead frames 121 and 131 or a bottom of the cavity 101 may be greater than 90°, for example, be in a range of 91° to 120° to improve an extraction efficiency of light. The angle θ1 of the second inner side 72 may be the same as or differ from the angle θ1 of the first inner side 71, but the embodiment is not limited to the above.

As shown in FIG. 5, an angle θ2 between the fourth inner side 74 of the cavity 101 and the top surfaces of the lead frames 121 and 131 or the bottom of the cavity 101 may be greater than 90°, for example, be in a range of 91° to 120° to improve an extraction efficiency of light. The angle θ2 of the fourth inner side 74 may be the same as or differ from the angle of the third inner side 73. However, the embodiment is not limited to the above.

The first to fourth inner sides 71, 72, 73, and 74 of the cavity 101 may be inclined toward the top surfaces of the lead frames 121 and 131 or the bottom of the cavity 101 at the same angle. For example, the angles θ1 and θ2 may be in the range of 91° to 97°.

The first lead frame 121 and the second lead frame 131 are disposed in the cavity 101. The first lead frame 121 extends under the first, third, and fourth inner sides 71, 73, and 74 in the cavity 101. The second lead frame 131 extends under the second, third, and fourth inner sides 72, 73, and 74 in the cavity 101.

A light emitting chip 171 is mounted on the first lead frame 121 and a protective chip 173 is mounted on the second lead frame 131. The light emitting chip 171 is bonded and electrically connected to the first lead frame 171, and is connected to the second lead frame 131 through at least one wire 175. The protective chip 173 is bonded and electrically connected to the second lead frame 131, and is connected to the first lead frame 121 through a wire 176.

As shown in FIGS. 2 and 3, the cavity 101 includes a recess region 76 formed in at least one of the first to fourth inner sides 71 to 74, for example, the third inner side 73. The recess region 76 is disposed in the third inner side 73, and is convexly formed from the third inner side 73 to a direction of a third side surface 63. The recess region 76 is disposed in the third inner side 73 which is the longest one of the first to fourth inner sides 71 to 74.

The recess region 76 includes a sidewall 75 and a plurality of extension parts R2 connected to the sidewall 75 and the third inner side of the cavity 101. The extension parts R2 are connected to both sides of the sidewall 75, and may have a curved surface or a bent surface. However, the embodiment is not limited to the above.

An exposed area of the second lead frame 121 may be further increased due to the recess region 76. Because the recess region 76 widens a space between the sidewall 75 and the light emitting chip 171, a space for bonding a wire 176 connected to the protective chip 173 can be disposed. Thus, it is not necessary to increase an area of the cavity 101 by reducing the size of the light emitting chip 171 or increasing the size of the body 111.

A width D11 of the recess region 76 may be in the range of 1/5.5 to 1/4.5 of a length Y2 of the cavity 101 or a length of the third inner side 73, for example, be in the range of 300 μm to 500 μm. A width D1 of a sidewall 75 in the recess region 76 may be the same as or differ from the width D11 of the recess region 76, for example, be in the range of 350 μm to 450 μm. The width D11 of the recess region 76 may be equal to or 1.1 times greater than a diameter of a ball 177 of the wire 176 in consideration of the diameter of the ball 177 of the wire 176.

The width D11 of the recess region 76 may be set in a small size in the range of 1/5.5 to 1/4.5 of the length Y2 of the cavity 101 or the length of third inner side 73. In this case, when the width D11 of the recess region 76 is too wide, a structure of the cavity 100 may become weak and a beam distribution of light may vary. When the width D11 of the recess region 76 is too narrow, insertion of a tool for bonding the wire 176 becomes difficult.

When the width D11 of the recess region 76 is too wide, the third side surface 63 of the body 111 may be weak against external shock or moisture.

An interval D2 between a sidewall 75 of the recess region 76 and the light emitting chip 171 is greater than an interval E1 between the third inner side 73 of the cavity 101 and the light emitting chip 171. For example, a depth D3 of the recess region 76 may have a size of at least 40 μm from the third inner side 73 of the cavity 101, for example in the range of 50 μm to 95 μm. The recess region 76 is disposed in the third inner side 73 of the cavity 101 to secure an area of bonding the wire 176 in a region between the third inner side 73 of the cavity 101 and the light emitting chip 171, so that the wire 176 can be prevented from being biased in one direction of the light emitting chip 171. In addition, a problem caused by the protective chip 173 disposed in a region other than the cavity 101 may be solved. Accordingly, the size of the light emitting chip 171 may be maximized as compared with an area of the cavity 101 so that a light emitting device having improved intensity of light can be disposed.

The sidewall 75 of the recess region 76 may be spaced apart from the light emitting chip 171 by a predetermined distance D2 to readily insert a structure for wire bonding and to prevent a sidewall 75 part of the recess region 76 from being damaged.

An interval E1 between the light emitting chip 171 and the third inner side 73 of the cavity 101 is greater than an interval E2 between the light emitting chip 171 and the fourth inner side 74. For example, the interval E1 is greater than the interval E2 by 80 μm. Accordingly, a space between the light emitting chip 171 and the sidewall 75 of the recess region 76 may be sufficiently secured. The interval E1 may be less than or equal to 300 μm, for example, be in the range of 200 μm to 300 μm, and the interval E2 is less than or equal to 200 μm, for example, be in the range of 80 μm to 200 μm. However, the embodiment is not limited to the above. A length D1 between a first side surface of the light emitting chip 171 and the sidewall 75 of the recess region 76 may be 1.5 to 3.5 times greater than an interval between a second side surface opposite to the first side surface of the light emitting chip 171 and the fourth inner side 74 of the cavity 101.

A location of the recess region 76 is described. The recess region 76 extends from the gap part 115 formed in a bottom of the cavity 101 to a partial region of the first lead frame 121. The recess region 76 may be disposed closer to the second inner side 72 than to the first inner side 71. As the recess region 76 is located closer to the protective chip 173, a straight line section D8 of the wire 176 becomes short. Accordingly, external shock applied to the wire 176 may be reduced.

An interval D6 between the sidewall 75 of the recess region 76 and a third side surface 63 of the body 111 may be less than each interval D7 between the first to fourth inner sides 71 to 74 and side surfaces 61 to 64 of the body 111. For example, the interval D6 may be less than an interval D7 between the third inner side 73 and the third side surface 63, for example, be in the range of 40 μm to 70 μm.

An interval E4 between the light emitting chip 171 and a second inner side 72 may be in the range of 500 μm to 650 μm, and an interval E3 between the light emitting chip 171 and the first inner side 71 may be in the range of 75 μm to 95 μm. That is, the interval E4 may be five times greater than the interval E3.

As shown in FIG. 5, an angle θ3 of the sidewall 75 may be less than an angle θ2 of the third inner side 73 in the recess region 76. The angle θ3 of the sidewall 75 may be in the range of 90° to 92°, for example, 90° (right angle) at a top surface of the lead frame 121. The angle θ3 of the sidewall 75 is 1° to 3° less than angles θ2 and θ1 of other inner sides 71 to 74.

A structure of the lead frame is described with reference to FIGS. 2, 6 to 12. The first lead frame 121 includes at least one first protrusion 126 exposed to the first side surface 61 of the body 111, a second protrusion 127 exposed to the third side surface 63, and a third protrusion 128 exposed to the fourth side surface 64. The first to third protrusions 126 to 128 are spaced apart from a bottom surface 117 of the body 111 by a predetermined interval G1. The interval G1 may be equal to or greater than 10 μm and be 50% less than a thickness T1 of the first lead frame 121.

The second lead frame 131 includes at least one fourth protrusion 136 exposed to the second side surface 62 of the body 111, a fifth protrusion 137 exposed to the third side surface 63, and a sixth protrusion 138 exposed to the fourth side surface 64. The fourth to sixth protrusions 136, 137, and 138 are spaced apart from a bottom surface 117 of the body 111 by a predetermined interval G1. The interval G1 may be equal to or greater than 10 μm and be 50% less than a thickness T1 of the second lead frame 131.

Referring to FIGS. 11 and 12, the second and third protrusions 127 and 128 of the first lead frame 121 protrude to directions opposite to each other, and the fifth and sixth protrusions 137 and 138 of the second lead frame 131 protrude to directions opposite to each other. Corner parts of the first and second lead frames 121 and 131 may have an angled shape or a curved shape.

As shown in FIGS. 4, 5, and 10, the first and second lead frames 121 and 131 include a lead region which may be bonded onto a printed circuit board (PCB). A first lead region 125 of the first lead frame 121 is exposed to a bottom surface 117 of the body 111 and is disposed between first and second recess portions 122 and 123. A second lead region 135 of the second lead frame 131 is exposed to a bottom surface 137 of the body 111, and is disposed between the gap part 115 and the third recess portion 133.

An interval C5 between the first and second lead regions 125 and 135 is greater than an interval between first and second lead frames 121 and 131 of a bottom of the cavity 101. A length C1 of the first lead region 125 may be greater than a length C2 of the second lead region 135. However, the embodiment is not limited to the above. The length C1 of the first lead region 125 may be in the range of 0.5 mm±0.1 mm, and the length C2 of the second lead region 135 may be in the range of 0.4 mm±0.05 mm. Because an area of the first lead area 125 is wider than an area of the second lead region 135, heat may be efficiently dissipated.

An interval C3 between the first and second lead regions 125 and 135 is set by taking an interval with respect to a circuit pattern of a printed circuit board (PCB) into consideration to provide a general purpose light emitting device. Accordingly, an area of a bottom surface of the first lead frame 121 is narrower, for example, at least 30% narrower than an area of a top surface of the first lead frame 121.

A plurality of recess portions making contact or coupled with a support body 112 of the body 111 may be disposed in lower portions of the first lead frame 121 and the second lead frame 131, and the recess portions may be defined as a recess region.

For example, the first lead frame 121 includes a first recess portion 122 and a second recess portion 123. The first recess portion 122 is formed in a region between the first lead region 125 of the first lead frame 121 and the gap part 115, and a support body 112 is disposed in the first recess portion 122 as shown in FIG. 5. A width of the first recess portion 122 is the same as a width X1 of the body 111 or a length of the first side surface 11. A depth B4 of the first recess portion 122 is at least twice greater than a depth of the second recess portion 123. The first recess portion 122 is disposed as a stepped structure under an inner region of the first lead frame 121, and is coupled with the support body 112 of the body 111.

The depth B4 of the first recess portion 122 may be in the range of 30 to 60% of the length B1 of the first lead frame 121, and has a stepped structure with respect to a flat surface of the first lead region 125. The first recess portion 122 may be 50% less than a thickness T1 of the first lead frame 121. The first recess portion 122 may increase a moisture penetration path to the extent of a top surface of the first lead frame 121 on which the light emitting chip 171 is mounted.

If the light emitting chip 171 is fabricated in a large size, the size of the first lead frame 121 on which the light emitting chip 171 is mounted is increased proportional to the size of the light emitting chip 171. If the area of a top surface of the first lead frame 121 exposed to the cavity 101 is increased, strength in an area between the first lead frame 121 and the second lead frame 131 becomes weaker. Accordingly, the width of the gap part 115 is increased without reducing the area of the top surface of the first lead frame 121. That is, the first recess portion 122 is formed in a lower portion of the first lead frame 121 to secure an area of the gap part 115 so that strength in a region between the first and second lead frames 121 and 131 may be reinforced.

The second recess portion 123 of the first lead frame 121 is adjacent to the first side surface 61 of the body 111, is stepped from the first lead region 125 under the first protrusion 126, and is coupled with a lower portion of the body 111, that is, the support body 112.

The second lead frame 131 includes third to fifth recess portions 132, 133, and 134 having a stepped structure under the fourth to sixth protrusions 136, 137, and 138. The third recess portion 132 is formed in a region adjacent to the gap part 115. A support body 112, which is a lower portion of the body 111 and stepped from the second lead region 135 of the second lead frame 131, is coupled to the fourth recess portion 133. The fifth recess portion 134 may be disposed with a stepped structure under the fifth and sixth protrusions 137 and 138. Thicknesses of the third to fifth recess portions 132, 133, and 134 may be 50% or less than a thickness T1 of the second frame 131.

The recess portions 122, 123, 132, 133, and 134 include a curved surface having a predetermined curvature at a bending portion thereof. The curved surface may increase a contact area with the support body 112 and a moisture permeation path.

A thickness T2 of each of the first and second lead frame may be in the range of 0.15 mm to 0.8 mm, for example, in the range of 0.25 mm to 0.35 mm. The first lead frame 121 and the second lead frame 131 may include a metallic material, for example, at least one of titanium (Ti), copper (Cu), nickel (Ni), gold (Au), chrome (Cr), tantalum (Ta), platinum (Pt), tin (Sn), silver (Ag), and phosphorus (P), and may be configured as a single metal layer or multi-metal layers. The foregoing embodiment has illustrated that a thickness T2 of the second lead frame 131 is the same as a thickness T2 of the first lead frame 121. However, the embodiment is not limited to the above.

The light emitting chip 171 may selectively emit light in the range from a visible ray band to an ultraviolet (UV) band. For example, one of a red LED chip, a blue LED chip, a green LED chip, a yellow green LED chip, a UV LED chip, and a white LED chip may be selected as the light emitting chip 171. The light emitting chip 171 includes an LED chip having at least one of a compound semiconductor of group III-V elements and a compound semiconductor of group II-VI elements. One or a plurality of light emitting chips 171 may be disposed in the cavity 101. However, the embodiment is not limited to the above. The light emitting chip 171 may be a vertical chip including an anode and a cathode longitudinally disposed, a flip chip including an anode and a cathode disposed in one direction, or a horizontal chip including an anode and a cathode laterally disposed. A longitudinal length Y3 of the light emitting chip 171 may be in the range of 0.5 mm to 1.5 mm, and a transverse length X3 of the light emitting chip 171 may be in the range of 0.5 mm to 1.5 mm. However, the embodiment is not limited to the above. A longitudinal length of the light emitting chip 171 may be the same as or differs from a transverse length of the light emitting chip 171, and a thickness of the light emitting chip 171 may be in the range of 100 μm to 300 μm. The protective chip 173 may include a chip such as a thyristor, a zener diode, or a transient voltage suppression (TVS). However, the embodiment is not limited to the above.

A molding member 161 is disposed in the cavity 101, and covers an upper portion of the light emitting chip 171. The molding member 161 includes a light-transmitting resin layer such as silicon or epoxy and may have a single layer structure or a multiple layer structure. The molding member 161 may include a phosphor for converting wavelength of light radiated from the light emitting chip 171. The phosphor excites a part of light radiated from the light emitting chip 171 to emit light having another wavelength. The phosphor may include one selected from YAG, TAG, Silicate, Nitride, and oxynitride materials. The phosphor may have at least one of a red phosphor, a yellow phosphor, and a green phosphor, but the embodiment is not limited thereto. A top surface of the molding member 161 may have a flat shape, a concave shape, a convex shape, or a light exit surface. A lens may be disposed in an upper portion of the molding member 161, and may include a lens being convex or concave with respect to the light emitting chip 171, and a convex lens having a total reflection surface at a central portion thereof, but the embodiment is not limited thereto.

As another embodiment, a phosphor layer may be further disposed on the light emitting chip 171, and molding members having reflection characteristics may be disposed between the inner sides 71 to 74 and side surfaces of the light emitting chip 171, respectively. The reflecting material includes a material capable of reflecting at least 70% of the light emitted from the light emitting chip 171. A light-transmitting molding member may be disposed on the molding member having the reflection characteristics, but the embodiment is not limited thereto.

Figure 13:
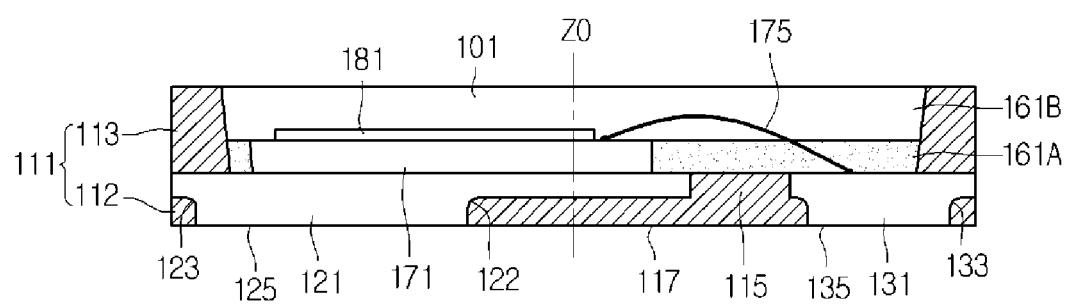
FIG. 13 is a side sectional view illustrating a light emitting device according to a second embodiment.

FIG. 13 is a side sectional view illustrating a light emitting device according to a second embodiment. A structure of the cavity 101 of the light emitting device shown in FIG. 13 may have a structure shown in the first embodiment, and the same parts refer to the description of the foregoing embodiment.

Referring to FIG. 13, a phosphor layer 181 is disposed on the light emitting chip 171, a phosphor may not be added in the molding member 161 or a phosphor having a type different from that of the phosphor added in the phosphor layer 181 may be added in the molding member 161.

The phosphor layer 181 may have an area smaller than an area of a top surface of the light emitting chip 171 or be disposed on a top surface and a side of the light emitting chip 171, but the embodiment is not limited to the above. The phosphor layer 181 may include at least one of a blue phosphor, a yellow phosphor, a red phosphor, and a green phosphor.

The cavity 101 includes a first molding member 161A having a height lower than the top surface of the light emitting chip 171, and a second molding member 161B disposed on the light emitting chip 171 and the first molding member 161A. The first and second molding members 161A and 161B may include metal oxide. For example, the first and second molding members 161A and 161B may be formed by using the same metal oxide or different metal oxides. The light emitting chip 171 in the cavity 101 may be inclined toward a direction of the first inner side 71 from the center Z0 of the cavity 101.

The first molding member 161A includes first metal oxide or nitride, and the second molding member 161B includes second metal oxide or nitride. The first metal oxide or nitride includes one of $SiO_2$, $SiO_x$, $SiO_xN_y$, $Si_3N4$, $Al_2O_3$, and $TiO_2$, and the second metal oxide or nitride includes one of $SiO_2$, $SiO_x$, $SiO_xN_y$, $Si3N4$, $Al_2O_3$, and $TiO_2$. The first metal oxide or nitride may have a different material from the second metal oxide or nitride.

The first metal oxide in the range of 7.5 wt % to 12.5 wt % may be added into the first molding member 161A. Accordingly, the first molding member 161A functions as a reflecting layer disposed around the light emitting chip 171. The second metal oxide or nitride in the range of 7.5 wt % to 12.5 wt % may be added into the second molding member 161B. Accordingly, the second molding member 161B may function on the light emitting chip 171 as a diffusion layer.

Figure 14:
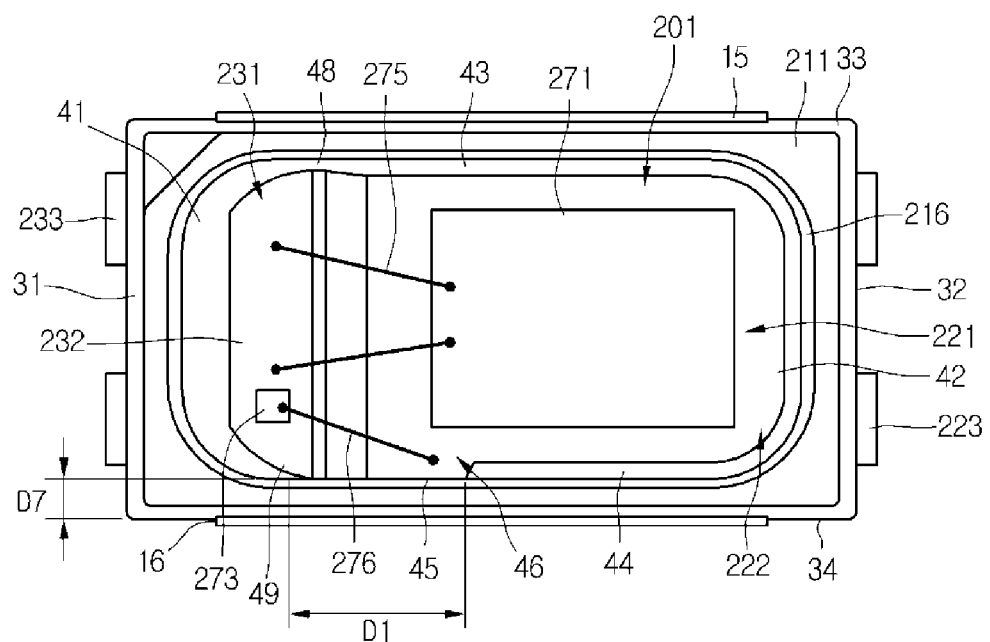
FIG. 14 is a plan view illustrating a light emitting device according to a third embodiment.
Figure 15:
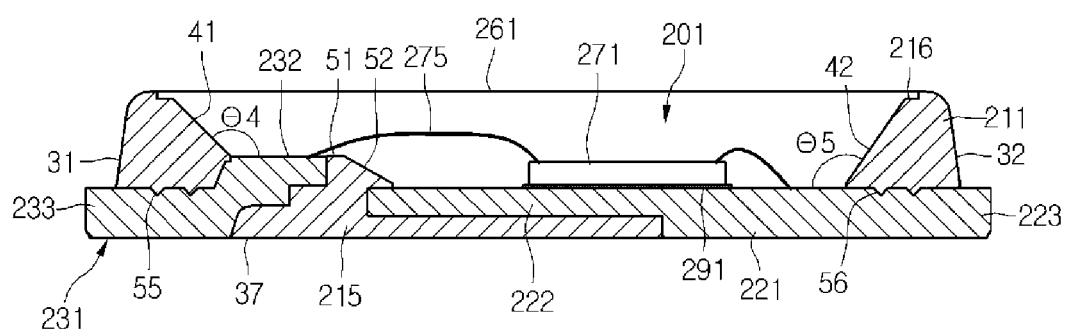
FIG. 15 is a side sectional view of the light emitting device shown in FIG. 14.

FIG. 14 is a plan view illustrating a light emitting device according to a third embodiment, and FIG. 15 is a side sectional view of the light emitting device shown in FIG. 14. In a description of the third embodiment, the same parts refer to the first embodiment.

Referring to FIGS. 14 and 15, a light emitting device includes a body 211 including a cavity 201 having a recess region 47, a plurality of lead frames 221 and 231 disposed in the body 211, at least one light emitting chip 271 disposed on one of the lead frames 221 and 231, a protective chip 273, and a molding member 261.

The body 211 includes first to fourth side surfaces 31 to 34. Ribs 15 and 16 are longitudinally formed along the third and fourth side surfaces 33 and 34. The ribs 15 and 16 are formed longer than a width of the gap part 115 to reinforce the strength in the gap part 115 between the first and second lead frames 221 and 231. The rib 16 corresponds to the recess region 47 of the cavity 201 and has a length longer than a width of the recess region 47.

A width of a lower portion and a width of an upper portion of the gap part 115 are wide and narrow, respectively. The upper portion of the gap part 115 includes a first surface 51 which is flat and a second surface 52 inclined toward the first surface 51. The first surface 51 may be aligned on the same plane with a top surface of the second bonding part 232 or may be aligned on the plane different from the top surface of the second bonding part 232, and a height of the first surface 51 may be higher than the top surface of the light emitting chip 271. The second surface 52 corresponds to a side of the light emitting chip 271 to efficiently reflect light.

The cavity 201 includes at least first to fourth inner sides 41 to 44. The first to fourth inner sides 41 to 44 may have a plane or a curved surface. Surfaces connecting the first to fourth inner sides 41 to 44 to each other may be a curved surface or an angled surface. An upper periphery 216 of the body 211 may be stepped in a part connected to the cavity 201. A curved surface 48 being convex to the third side surface 33 is disposed at a part of the third inner side 43 adjacent to the first inner side 41, and a curved surface 49 being convex to the fourth side surface 33 is disposed at a region of the third inner side 43 adjacent to the first inner side 41 and corresponding to the curved surface 48.

The first lead frame 221 includes a first bonding part 222 disposed in a bottom of the cavity 201 and a plurality of first lead parts 223 protruding to the second side surface 32 of the body 211. The second lead frame 231 includes a second bonding part 232 disposed in the bottom of the cavity 201 and a second lead parts 233 protruding to the first side surface 31 of the body 211. The first lead parts 223 and the second lead parts 233 are exposed to a bottom surface of the body 211.

A rough structure such as concavo-convex patterns 55 and 56 or a recessed structure may be disposed in at least one of top surfaces and bottom surfaces of the first and second lead frames 221 and 231. The concavo-convex patterns 55 and 56 may improve coupling with the body 211 and suppress moisture permeation.

The top surface of the second bonding part 232 of the second lead frame 231 may be disposed at a location higher than the top surface of the first bonding part 222 of the first lead frame 221. Accordingly, in a depth of the cavity 201, a depth from the top surface of the body 211 to the first bonding part 222 of the first lead frame 221 may be greater than a depth from the top surface of the body 211 to the second bonding part 232 of the second lead frame 231.

The gap part 215 is disposed in a region between the first bonding part 222 and the second bonding part 232. The gap part 215 may include a stepped structure, for example, a surface in which at least a part is inclined.

An angle θ4 between the first bonding part 222 of the first lead frame 221 and the second inner side 42 of the cavity 201 may be in the range of 91° to 160°. An angle θ5 between the second boding part 131 and the first inner side 41 of the cavity 201 may be less than the angle θ3, for example, be in the range of 90° to 140°. An inclined angle of the second inner side 42 may be the same as an inclined angle of the first inner side 41.

The light emitting chip 271 is connected to a conductive adhesive member 291 on the first lead frame 221, and is connected to the second lead frame 231 through a wire 275. The protective chip 273 is formed above the second lead frame 231 and is connected to the first lead frame 221 through a wire 276.

A recess region 46 is disposed in the fourth inner side 44 of the cavity 201. The recess region 46 is convex outward of the body 411 as compared with the fourth inner side 44, that is, in the direction of the fourth side surface 34 of the body 411. A wire 276 connected to the protective chip 273 is connected between the recess region 46 and the light emitting chip 271. Accordingly, even if the wire 276 connected to the protective chip 273 is disposed in a region adjacent to the light emitting chip 271, it is not necessary to excessively move the light emitting chip 271.

The sidewall 45 of the recess region 46 may be vertically formed on the top surface of the first lead frame 221. The sidewall 45 of the recess region 46 may be disposed to the outside as compared with the fourth inner side 44 of the cavity 201 so the a space between the light emitting chip 271 and the sidewall 45 may be secured. A width D1 of the recess region 46, a thickness D7 of the fourth side surface 34, and a depth of the recess region refer to the first embodiment.

A molding member 261 may be disposed in the cavity 201. The molding member 261 includes a transmissive resin layer such as silicon or epoxy and may have a single layer structure or a multiple layer structure.

The embodiment has been described in that the recess regions are formed in one location. However, a space for a wire connected to a plurality protective chips may be secured by arranging the recess regions in opposite inner sides, respectively.

Figure 16:
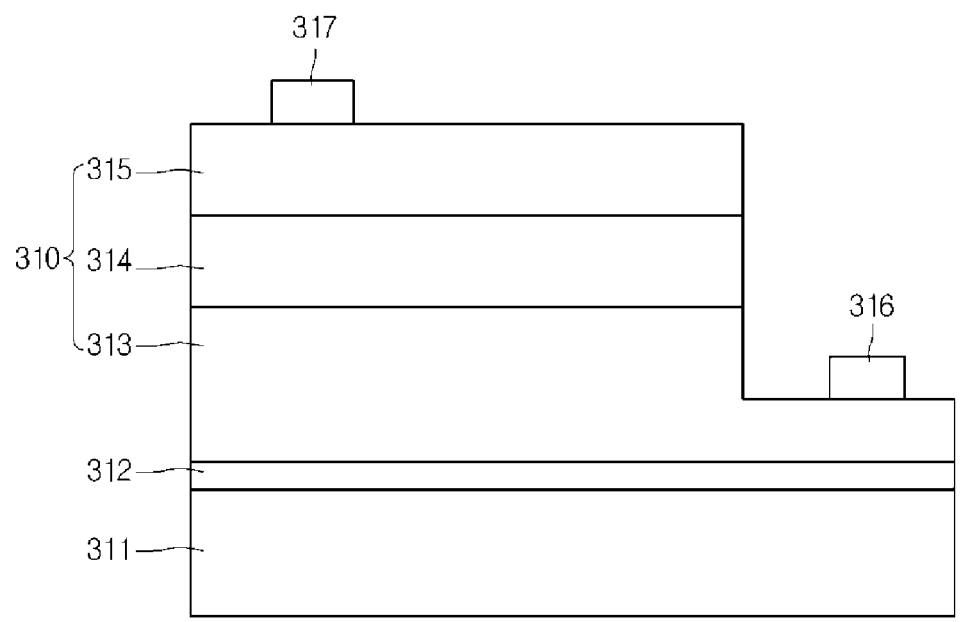
FIG. 16 is a view illustrating an example of a light emitting chip of the light emitting device according to the embodiment.

FIG. 16 is a side sectional view showing one example of the light emitting chip according to the embodiment.

Referring to FIG. 16, the light emitting chip includes a substrate 311, a buffer layer 312, a light emitting structure 310, a first electrode 316, and a second electrode 317. The substrate 311 may include a substrate including a transmissive material or a non-transmissive material, and may include a conductive substrate or an insulating substrate.

The buffer layer 312 reduces the lattice constant difference between the materials constituting the substrate 311 and the light emitting structure 310, and may include a nitride semiconductor. A nitride semiconductor layer, which is not doped with dopants, is further disposed between the buffer layer 312 and the light emitting structure 310, so that the crystal quality can be improved.

The light emitting structure 310 includes a first conductive semiconductor layer 313, an active layer 314, and a second conductive semiconductor layer 315.

The first conductive semiconductor layer 313 may include the group III-V compound semiconductor doped with the first conductive dopant. For example, the first conductive semiconductor layer 313 may include the semiconductor material having the compositional formula of $In_xAl_yGa_{1-x-y}N$ ($0 \leq x \leq 1$, $0 \leq y \leq 1$, $0 \leq x+y \leq 1$). In detail, the first conductive semiconductor layer 313 may include the stack structure of layers including one selected from the group consisting of GaN, InN, AlN, InGaN, AlGaN, InAlGaN, AlInN, AlGaAs, GaP, GaAs, GaAsP, and AlGaInP. If the first conductive semiconductor layer 313 is an n type semiconductor layer, the first conductive dopant includes the n type dopant such as Si, Ge, Sn, Se, or Te.

A first clad layer may be formed between the first conductive semiconductor layer 313 and the active layer 314. The first clad layer may include a GaN-based semiconductor, and the bandgap of the first clad layer may be equal to or greater than the bandgap of the active layer 314. The first clad layer has the first conductive type, and confines carriers.

The active layer 314 is disposed on the first conductive semiconductor layer 313, and includes a single quantum well structure, a multiple quantum well (MQW) structure, a quantum wire structure or a quantum dot structure. The active layer 314 has the cycle of the well and barrier layers. The well layer may have the composition formula of $In_xAl_yGa_{1-x-y}N$ ($0 \leq x \leq 1$, $0 \leq y \leq 1$, $0 \leq x+y \leq 1$), and the barrier layer may have the composition formula of $In_xAl_yGa_{1-x-y}N$ ($0 \leq x \leq 1$, $0 \leq y \leq 1$, $0 \leq x+y \leq 1$). At least one cycle of the well/barrier layers may be used through the stack structure of InGaN/GaN, GaN/AlGaN, InGaN/AlGaN, InGaN/InGaN, InAlGaN/AlGaN and InAlGaN/InAlGaN. The barrier layer may include a semiconductor material having the bandgap higher than the bandgap of the well layer.

The second conductive layer 315 is formed on the active layer 314. The second conductive layer 315 includes a semiconductor doped with second conductive dopants, for example, includes a semiconductor having the composition formula of $In_xAl_yGa_{1-x-y}N$ ($0 \leq x \leq 1$, $0 \leq y \leq 1$, $0 \leq x+y \leq 1$). In detail, the second conductive semiconductor layer 315 may include one selected from compound semiconductors such as GaN, InN, AlN, InGaN, AlGaN, InAlGaN, AlInN, AlGaAs, GaP, GaAs, GaAsP, and AlGaInP. If the second conductive semiconductor layer 315 is a p type semiconductor layer, the semiconductor conductive dopant includes the p type dopant such as Mg, Zn, Ca, Sr, or Ba.

The second conductive semiconductor layer 315 may include a superlattice structure, and the superlattice structure may include an InGaN/GaN superlattice structure or an AlGaN/GaN superlattice structure. The superlattice structure of the second conductive semiconductor layer 315 abnormally spreads the current, thereby protecting the active layer 314.

In addition, the light emitting structure 310 may have an opposite conductive type. For example, the first conductive semiconductor layer 313 may include a P type semiconductor layer, and the second conductive semiconductor layer 315 may include an N type semiconductor layer. The second conductive semiconductor layer 315 may be disposed thereon with a first conductive semiconductor layer having the polarity opposite to the second conductive type polarity.

The light emitting structure 310 may be realized by using one of an n-p junction structure, a p-n junction structure, an n-p-n junction structure, and a p-n-p junction structure. The "p" represents a p type semiconductor, the "n" represents an n type semiconductor layer, and the "-" represents that the p type semiconductor is directly or indirectly connected to the n type semiconductor. Hereinafter, a case that the uppermost layer of the light emitting structure 310 is the second conductive semiconductor layer 315 will be described for the convenience of explanation.

The first electrode 316 is disposed on the first conductive semiconductor layer 313, and the second electrode 317 having a current spreading layer is disposed on the second conductive semiconductor layer 315. The first and second electrodes 316 and 317 are connected to each other through a wire, or through another connection scheme.

Figure 17:
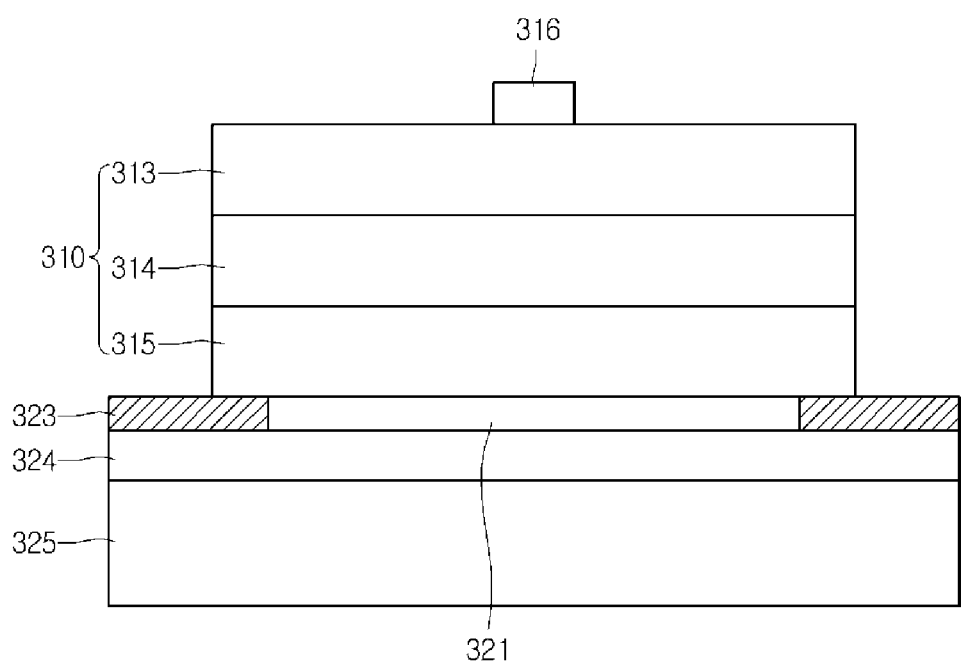
FIG. 17 is a view illustrating another example of a light emitting chip of the light emitting device according to the embodiment.

FIG. 17 is a graph showing another example of the light emitting chip according to the embodiment. Hereinafter, in the following description of the embodiment, the details of the same parts as that of FIG. 16 will be omitted except for brief description.

Referring to FIG. 17, in a light emitting chip according to the embodiment, a contact layer 321 is formed under a light emitting structure 310, a reflective layer 324 is formed under the contact layer 321, a support member 325 is formed under the reflective layer 324, and a protective layer 323 may be formed around the reflective layer 324 and the light emitting structure 310.

One or a plurality of first electrodes 316 may be formed on the light emitting structure 310, and the first electrode 316 includes a pad bonded to a wire.

The light emitting chip may be formed by removing a growth substrate after forming a contact layer 321, a protective layer 323, a reflective layer 324, and a support member 323 under the second conductive semiconductor layer 315.

The contact layer 321 may make ohmic-contact with a lower layer of the light emitting structure 310, for example, the second conductive semiconductor layer 315, and may include a metallic oxide, a metallic nitride, an insulating material, or a conductive material. For example, the contact layer 321 may include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), Ag, Ni, Al, Rh, Pd, Ir, Ru, Mg, Zn, Pt, Au, Hf, and the selective combination thereof. The contact layer 321 may be formed in a multi-layer structure by using a metallic material and a transparent material such as IZO, IZTO, IAZO, IGZO, IGTO, AZO, or ATO. For example, the contact layer 321 may have the stack structure of IZO/Ni, AZO/Ag, IZO/Ag/Ni, or AZO/Ag/Ni. A layer to block current may be further formed in the contact layer 321 corresponding to the electrode 316.

The protective layer 323 may include a metallic oxide or an insulating material. For example, the protective layer 323 may selectively include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $SiO_2$, $SiO_x$, $SiO_xN_y$, $Si_3N_4$, $Al_2O_3$, or $TiO_2$. The protective layer 323 may be formed through a sputtering scheme or a deposition scheme. The metal constituting the reflective layer 324 may prevent the layers of the light emitting structure 310 from being shorted.

The reflective layer 324 may include metal such as Ag, Ni, Al, Rh, Pd, Ir, Ru, Mg, Zn, Pt, Au, Hf, or the selective combination thereof. The reflective layer 324 may have a width greater than the width of the light emitting structure 310, thereby improving the light reflection efficiency. A metallic layer for bonding and a metallic layer for thermal diffusion may be further disposed between the reflective layer 324 and the support member 325, but the embodiment is not limited thereto.

The support member 325 serves as a base substrate, and may include metal such as Cu, Au, Ni, Mo, or Cu—W, and a carrier wafer, such as Si, Ge, GaAs, ZnO, and SiC. An adhesive layer may be further formed between the support member 325 and the reflective layer 324, and bonds the two layers to each other. The disclosed light emitting chip is four the illustrative purpose, and the embodiment is not limited thereto. The light emitting chip may be selective applied to the light emitting device according to the embodiment, but the embodiment is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 18 and 19, a lighting apparatus shown in FIG. 20, a lighting lamp, a camera flash, a signal lamp, a headlamp for a vehicle, and an electronic display.

Figure 18:
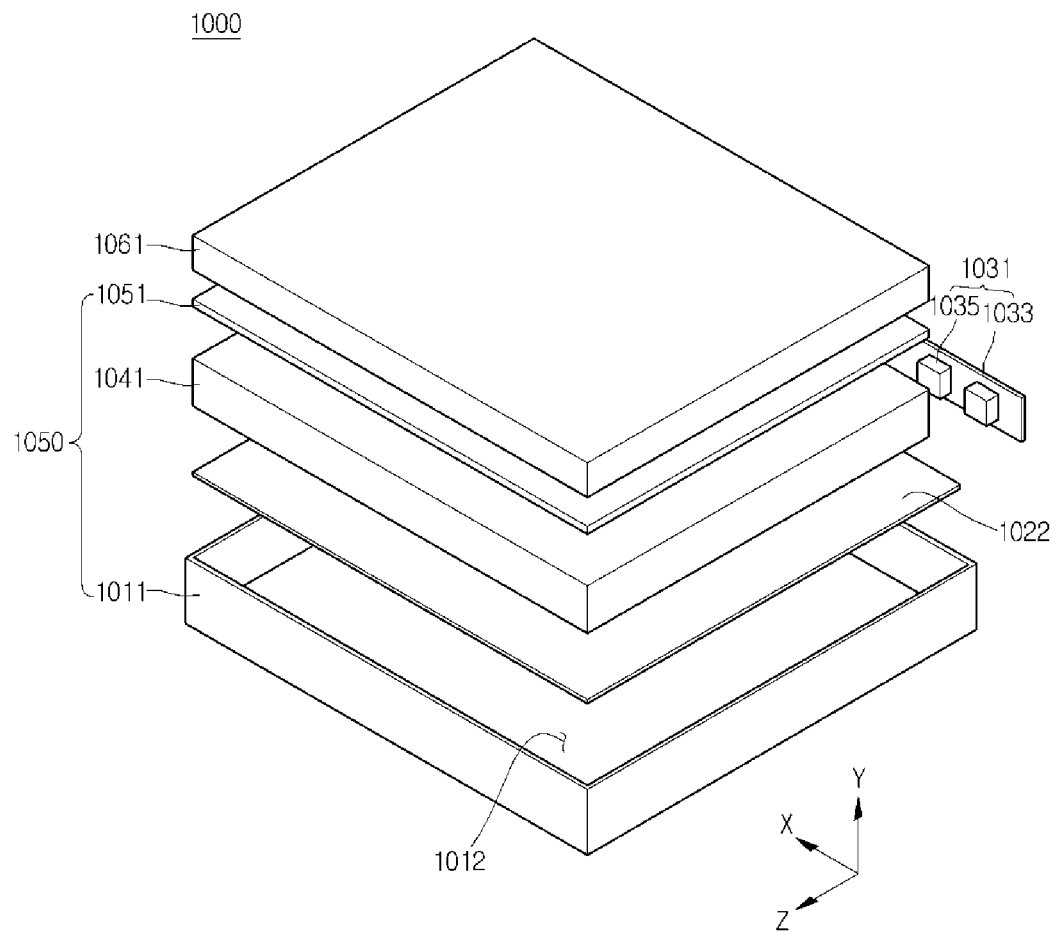
FIG. 18 is a perspective view illustrating a display apparatus including a light emitting device according to the embodiment.

FIG. 18 is an exploded perspective view showing a display apparatus having the light emitting device according to the embodiment.

Referring to FIG. 18, a display apparatus 1000 according to the embodiment includes a light guide plate 1041, a light source module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light source module 1031 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light source module 1031 is disposed on at least one side of the light guide plate 1041 to supply the light to at least one side of the light guide plate 1041. The light source module 1031 serves as the light source of the display device.

At least one light source module 1031 is disposed to directly or indirectly supply the light from one side of the light guide plate 1041. The light source module 1031 may include a substrate 1033 and the light emitting device according to the embodiments or the light emitting device 1035. The light emitting device or the light emitting device 1035 are arranged on the substrate 1033 while being spaced apart from each other at the predetermined interval.

The substrate 1033 may include a printed circuit board (PCB) including a circuit pattern (not shown). In addition, the substrate 1033 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the substrate 1033 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the substrate 1033, but the embodiment is not limited thereto. The light emitting device 1035 may directly or indirectly supply the light to a light incident surface, which is one side of the light guide plate 1041, but the embodiment is not limited thereto.

The reflective member 1022 is disposed under the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

Figure 19:
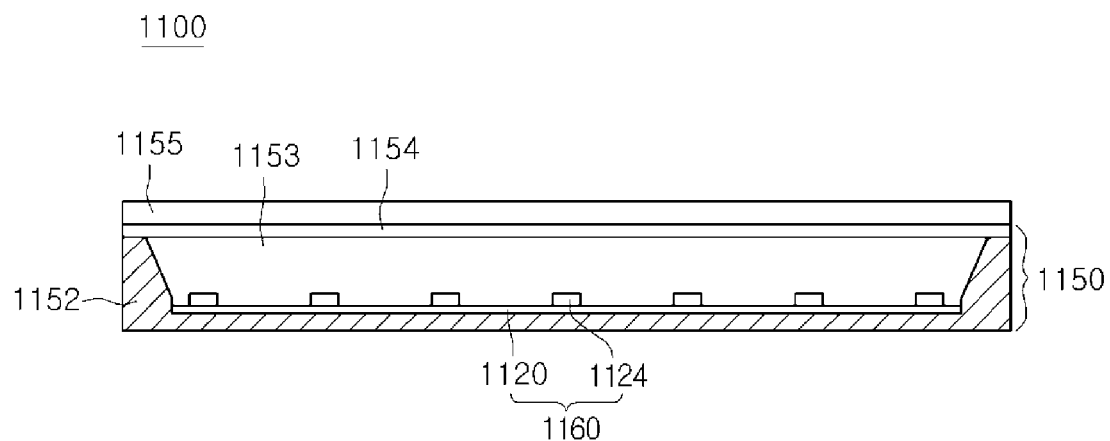
FIG. 19 is a perspective view illustrating a display apparatus including a light emitting device according to the embodiment.

FIG. 19 is a sectional view showing a display apparatus according to the embodiment.

Referring to FIG. 19, the display apparatus 1100 includes a bottom cover 1152, a substrate 1120 on which the light emitting device 1124 are arrayed, an optical member 1154, and a display panel 1155.

The substrate 1120 and the light emitting device 1124 may constitute the light source module 1160. In addition, the bottom cover 1152, at least one light source module 1160, and the optical member 1154 may constitute the light unit. The bottom cover 1151 can be disposed with a receiving section 1153, but the embodiment is not limited thereto. The light source module 1160 includes a substrate 1120, and a plurality of light emitting devices arranged on the substrate 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 20:
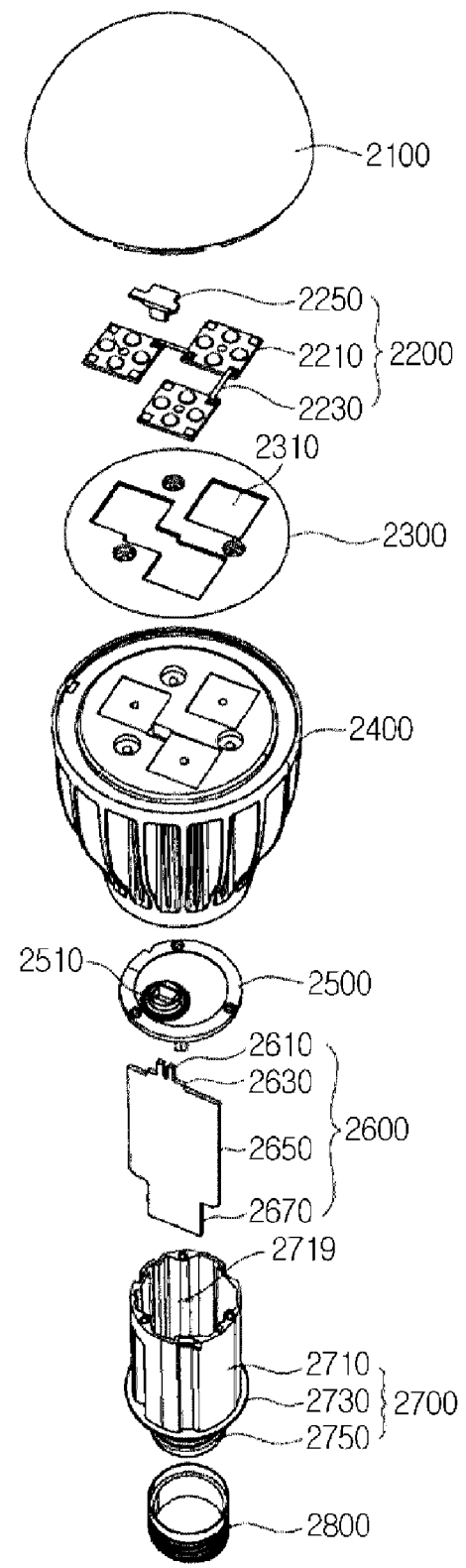
FIG. 20 is a perspective view illustrating a lighting system including a light emitting device according to the embodiment.

FIG. 20 is an exploded perspective view showing a lighting device having the light emitting device according to the embodiment.

Referring to FIG. 20, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light source module 220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

According to the embodiments, following effects can be achieved.

The embodiment can provide a recess region for bonding of a wire in one inner side of a cavity of the light emitting device. The embodiment can provide the cavity structure capable of easily mounting the large area light emitting chip or the plurality of light emitting chips. The embodiment can improve optical efficiency and reliability in the cavity of the light emitting device. The embodiment can efficiently support a lower region between the lead frames. The embodiment can improve reliability of the light emitting device and the lighting system including the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body including a cavity having first to fourth inner sides;
a first lead frame extending from a bottom of the cavity under the first inner side of the cavity;
a second lead frame extending from the bottom of the cavity under the second inner side of the cavity;
a gap part disposed in the bottom of the cavity and disposed between the first and second lead frames;
a light emitting chip disposed on the first lead frame;
a protective chip disposed on the second lead frame;
a recess region being convex outward of the body on at least one of the third and fourth inner sides of the cavity; and
a first wire connected to the protective chip and the second lead frame and including a part disposed between the light emitting chip and a sidewall of the recess region,
wherein the recess region has a smaller width than a width of the light emitting chip,
wherein each of the third and fourth inner sides has a length longer than a length of each of the first and second inner sides of the cavity,
wherein the recess region is formed in the third inner side,
wherein the first lead frame has a first region having a first thickness and a second region having a second thickness thinner than the first thickness,
wherein the light emitting chip is overlapped with the first region and the second region in a vertical direction,
wherein the first lead frame and the light emitting chip are electrically connected to an electrical conductive adhesive member which is disposed between the first lead frame and the light emitting chip, and
wherein a length of the light emitting chip is ½ times or greater than a length of the first lead frame and is ½ times or greater than a length of the third inner side of the cavity.

2. The light emitting device of claim 1, wherein the sidewall of the recess region is perpendicular to the first top surface of the first lead frame.

3. The light emitting device of claim 2, wherein a portion of the recess region is disposed on the gap part.

4. The light emitting device of claim 1, wherein the first lead frame includes a first top surface under the light emitting chip and a first bottom surface opposite to the top surface which is disposed under the light emitting chip,
wherein the second lead frame includes a second top surface under the protective chip and a second bottom surface opposite to the second top surface which is disposed under the protective chip, wherein the first bottom surface of the first lead frame and the second bottom surface of the second lead frame are exposed at a bottom surface of the body, wherein the first to fourth inner sides are inclined toward one of the first and second top surfaces of the first and second lead frames, wherein the first lead frame includes a first recess portion recessed from the gap part, and wherein the first recess portion of the first lead frame is overlapped with the light emitting chip in the vertical direction.

5. The light emitting device of claim 4, wherein the recess region has a width in a range of 1/5.5 to 1/4.5 relative to the length of the third inner side of the cavity.

6. The light emitting device of claim 1, wherein the recess region is formed in the third inner side of the cavity, and comprises a plurality of extension parts connecting the sidewall of the recess region to the third inner side of the cavity.

7. The light emitting device of claim 6, wherein the extension parts of the recess region comprise a curved surface.

8. The light emitting device of claim 1, wherein an interval between the light emitting chip and the third inner side is wider than an interval between the fourth inner side facing the third inner side and a third lateral surface of the light emitting chip, wherein an interval between a fourth lateral surface of the light emitting chip and the fourth inner side is less than or equal to 200 μm.

9. The light emitting device of claim 8, wherein a distance between the light emitting chip and the sidewall of the recess region is 1.5 times to 3.5 times the interval between the light emitting chip and the fourth inner side of the cavity.

10. The light emitting device of claim 1, wherein the width of the light emitting chip is ½ times or greater than a length of the first lead frame and the length of the light emitting chip is greater than a length of the second lead frame.

11. A light emitting device comprising:
a body including a cavity having first and second inner sides opposite to each other and third and fourth inner sides connected to the first and second inner sides and opposite to each other;
a first lead frame extending from a bottom of the cavity under the first inner side of the cavity;
a second lead frame extending from the bottom of the cavity under the second inner side of the cavity;
a gap part disposed in the bottom of the cavity and disposed between the first and second lead frames;
a light emitting chip disposed on the first lead frame;
a protective chip disposed on the second lead frame;
a recess region recessed outward of the body from at least one of the third and fourth inner sides of the cavity; and
a first wire connected to the second frame disposed between the light emitting chip and a sidewall of the recess region, wherein the first lead frame includes a first recess portion recessed from the gap part and a second recess portion recessed from an outer surface of the body and the first recess portion has a depth different from a depth of the second recess portion, wherein the recess region has a smaller width than a width of the light emitting chip, wherein the first recess portion of the first lead frame is overlapped with the light emitting chip in a vertical direction, wherein each of the third and fourth inner sides has a length longer than a length of each of the first and second inner sides of the cavity, wherein the recess region is formed in the third inner side, wherein the first lead frame has a first region having a first thickness, the first recess portion being in the second region, wherein the light emitting chip is overlapped with the first region and the second region in vertical direction, wherein the first lead frame and the light emitting chip are electrically connected to an electrical conductive adhesive member which is disposed between the first lead frame and the light emitting chip, and wherein a length of the light emitting chip is ½ times or greater than a length of the first lead frame and is ½ times or greater than a length of the third inner side of the cavity.

12. The light emitting device of claim 11, wherein the sidewall of the recess region is perpendicular to a first top surface of the first lead frame.

13. The light emitting device of claim 12, wherein a portion of the recess region is disposed on the gap part, and wherein the gap part has the same thickness as a thickness of the first lead frame.

14. The light emitting device of claim 11, wherein an interval between the sidewall of the recess region and an outer surface of the body is less than a thickness between the third inner side of the cavity and the outer surface of the body.

15. The light emitting device of claim 11, wherein the first lead frame includes a first top surface under the light emitting chip and a first bottom surface opposite to the top surface which is disposed under the light emitting chip, wherein the second lead frame includes a second top surface under the protective chip and a second bottom surface opposite to the second top surface which is disposed under the protective chip, wherein the first bottom surface of the first lead frame and the second bottom surface of the second lead frame are located at a bottom surface of the body, wherein the first top surface of the first lead frame is disposed lower than a top surface of the second lead frame which is disposed under the protective chip, and wherein a size of the first top surface of the first lead frame is greater than a size of the first bottom surface of the first lead frame.

16. The light emitting device of claim 11, wherein an interval between a fourth lateral surface of the light emitting chip and the fourth inner side is less than or equal to 200 μm, and an interval between a third lateral surface of the light emitting chip and the third inner side is less than or equal to 300 μm.

17. A light emitting device comprising:
a body including a cavity having first to fourth inner sides;
a first lead frame extending from a bottom of the cavity under the first inner side of the cavity;
a second lead frame extending from the bottom of the cavity under the second inner side of the cavity;
a gap part in the bottom of the cavity between the first and second lead frames;
a light emitting chip on the first lead frame;
a protective chip on the second lead frame;
a recess region being convex outward of the body from at least one of the third and fourth inner sides of the cavity; and
a first wire connected to the protective chip and the second lead frame and including one part disposed between the light emitting chip and a sidewall of the recess region, wherein an interval between the light emitting chip and the third inner side of the cavity is wider than an interval between the fourth inner side facing the third inner side and the light emitting chip, wherein the sidewall of the recess region is provided closer to the gap part than to the first inner side of the cavity, wherein each of the third and fourth inner sides has a length longer than a length of each of the first and second inner sides of the cavity, wherein the recess region is formed in the third inner side, wherein the first lead frame has a first region having a first thickness and a second region having a second thickness thinner than the first thickness, wherein the light emitting chip is overlapped with the first region and the second region n a vertical direction, wherein the first lead frame and the light emitting chip are electrically connected to an electrical conductive adhesive member which is disposed between the first lead frame and the light emitting chip, and wherein a length of the light emitting chip is ½ times or greater than a length of the first lead frame and is greater than a length of the second lead frame.

18. The light emitting device of claim 17, wherein the first lead frame includes a first top surface under the light emitting chip and a first bottom surface opposite to the top surface which is disposed under the light emitting chip, wherein the second lead frame includes a second top surface under the protective chip and a second bottom surface opposite to the second top surface which is disposed under the protective chip, wherein the first bottom surface of the first lead frame and the second bottom surface of the second lead frame are exposed at a bottom surface of the body, wherein a size of the first top surface of the first lead frame is greater than a size of the first bottom surface of the first lead frame, wherein the gap part is connected to the body, and a width of a bottom surface of the gap part is at least twice or greater than a width of a top surface of the gap part, wherein the first lead frame includes a first recess portion recessed from the gap part, and wherein the first recess portion of the first lead frame is overlapped with the light emitting chip in the vertical direction.

19. The light emitting device of claim 18, wherein an interval between the light emitting chip and the fourth inner side is less than or equal to 200 μm, and a distance between the light emitting chip and the sidewall of the recess region is 1.5 times to 3.5 times the interval between the light emitting chip and the fourth inner side of the cavity.

20. The light emitting device of claim 17, wherein an interval between the sidewall of the recess region and an outer surface of the body is less than an interval or a thickness between the third inner side and the outer surface of the body, and wherein the recess region has a smaller width than a width of the light emitting chip.

\* \* \* \* \*